United States Patent [19]

Cooper et al.

[11] Patent Number: 4,481,263
[45] Date of Patent: Nov. 6, 1984

[54] PROGRAMMABLE READ ONLY MEMORY

[75] Inventors: Kersi F. Cooper, San Jose; Jerry W. Drake, Los Gatos, both of Calif.

[73] Assignee: Raytheon Company, Lexington, Mo.

[21] Appl. No.: 535,122

[22] Filed: Sep. 23, 1983

Related U.S. Application Data

[62] Division of Ser. No. 378,585, May 17, 1982, Pat. No. 4,420,504, which is a division of Ser. No. 219,124, Dec. 22, 1980, abandoned.

[51] Int. Cl.³ .............................................. B05D 5/12
[52] U.S. Cl. .................................. 428/620; 428/627; 156/653
[58] Field of Search ................ 428/620, 627; 156/653, 156/664

[56] References Cited

U.S. PATENT DOCUMENTS

| | | | |
|---|---|---|---|
| 3,562,040 | 2/1971 | Garies | 156/664 |
| 3,838,442 | 9/1974 | Humphreys | 357/54 |
| 3,904,454 | 9/1975 | Magdo et al. | 156/653 |
| 4,182,781 | 1/1980 | Hooper et al. | 427/90 |

FOREIGN PATENT DOCUMENTS

| | | | |
|---|---|---|---|
| 4219 | 9/1979 | European Pat. Off. | 428/620 |
| 52-69283 | 6/1977 | Japan | 428/620 |
| 1112405 | 5/1968 | United Kingdom . | |

OTHER PUBLICATIONS

V. A. Dhaka et al., IBM Tech. Disclosure Bulletin, vol. II, No. 7, Dec. 1968 (Masking Technique).

*Primary Examiner*—Veronica O'Keefe
*Attorney, Agent, or Firm*—Richard M. Sharkansky; Joseph D. Pannone

[57] ABSTRACT

A programmable memory element for a programmable read only memory. The programmable memory element includes a Nichrome fusible link with a first metallization layer formed in contact with the Nichrome fusible link. An insulating layer is formed over the first metallization layer and over a portion of the Nichrome. The insulating layer is formed by first chemically vapor depositing a relatively thin layer of silicon dioxide at atmospheric pressure and then chemically vapor depositing a thicker layer of silicon nitride over the thin silicon dioxide layer, such silicon nitride layer being chemically vapor deposited in a vacuum.

3 Claims, 10 Drawing Figures

PROGRAMMABLE READ ONLY MEMORY

CROSS-REFERENCE TO RELATED APPLICATION(S)

This is a divisional of patent application Ser. No. 378,585, filed May 17, 1982, now U.S. Pat. No. 4,420,504 which is a divisional of application Ser. No. 219,124, filed Dec. 22, 1980 now abandoned.

BACKGROUND OF THE INVENTION

This invention relates generally to integrated circuits and manufacturing methods and more particularly to programmable read only memory (PROM) integrated circuits which include fusible links as programmable memory elements thereof.

As is known in the art, programmable read only memory integrated circuits have a wide range of applications in digital computation and processing systems. As is also known in the art, such PROM circuits are typically formed as a single semiconductor integrated circuit chip. In bipolar PROM circuits, a matrix of rows and columns of conductors have programmable memory elements connected between unique row and column conductor combinations. Each one of the programmable memory elements typically includes a diode and a serially connected fusible link. During programming, selected ones of the fusible links are blown, creating an open circuit between the previously electrically connected row conductor and column conductor connected to such blown fusible link. The resulting pattern of blown and unblown fusible links represents the data stored in the PROM. More particularly, a blown fusible link at a "location" defined by the unique row conductor-column conductor combination previously connected to such blown fusible link may represent a logical 0 signal stored at such location; whereas an unblown fusible link at a second address defined by a different row conductor-column conductor combination may represent a logical 1 signal stored at such second address.

As is also known in the art, one method used to form each one of the memory elements is to provide a semiconductor and deposit an insulating material such as silicon dioxide over a surface of the semiconductor. A window is formed in a region of the semiconductor where the diode portion of the memory element is to be formed to expose the underlying surface portion of the semiconductor. A Schottky diode is then formed in the semiconductor. A layer of fusible material, such as a nickel-chromium compound, commonly referred to as Nichrome, is deposited over the surface of the insulating material. The fusible material is then selectively masked and etched so that a fusible link is formed on a portion of the insulating material adjacent the window. Next, a first metallization layer is deposited over the fusible link and over the exposed insulating material and through the window onto the Schottky diode region. The metallization layer is then patterned into a column conductor in contact with a first end of the fusible link and a connector to connect a second end of the fusible link to the diode. In order to provide a second layer of metallization for say the row conductors of the PROM circuit, a second layer of metallization is generally formed over the structure including a portion of the fusible link between the ends thereof as well as a portion of the metallization layer of the row conductors. One technique used to provide the second layer of metallization has been to chemically vapor deposit silicon dioxide over the surface of the structure. The deposition is generally done in atmospheric pressure so that it provides a good moisture barrier for the Nichrome fusible link. However, with such deposition technique the chemically vapor deposited silicon dioxide forms cusps around the edges of the conductors making such insulating material difficult to metallize over for the second metallization layer. One technique used to reduce the effect of the cusps has been to form the first metallization layer with sloped or bevelled edges using conventional sloped etched techniques. One technique used uses a mask which allows some of the etchant to flow under the edge portions of the mask thereby resulting in the sloped etch. Such technique therefore requires that the mask be slightly larger than the desired metallization width thereby reducing the packing density of the device. While the use of an insulating layer of silicon nitride deposited directly on the Nichrome has been suggested, such direct deposition changes the resistive value of the Nichrome fusible link. Further, when such silicon nitride layer is deposited directly on the Nichrome fusible link and such link is blown it has been found that the silicon nitride ruptures thereby breaking down the desired dielectric insulation.

SUMMARY OF THE INVENTION

In accordance with the present invention, a fusible link has a first metallization layer in contact with first and second ends thereof. An insulating layer is formed over the first metallization layer and over a portion of the fusible link disposed between the first and second ends thereof. The insulating layer is formed by first chemically vapor depositing a relatively thin layer of silicon dioxide at atmospheric pressure and then chemically vapor depositing a thicker layer of silicon nitride over the thin silicon dioxide layer, such silicon nitride layer being chemically vapor deposited in a vacuum. The layer of silicon dioxide is thin enough so that any cusps formed around the corners of the first metallization layer are relatively small. The deposition of the silicon dioxide layer is performed at atmospheric pressure and allows the silicon dioxide to provide moisture protection to the fusible link. The deposited silicon nitride layer has sufficient thickness to provide the desired electrical insulation between a second metallization layer and the first metallization layer and the thin silicon dioxide layer provides a barrier to the silicon nitride layer so that the silicon nitride layer will not effect the resistivity of the fusible link and so that the silicon nitride layer will not rupture when the fusible link is blown. A first via hole mask and first etchant is used to form a via in the silicon nitride layer and then a second noncritical via hole mask and different etchant is used to etch the underlying silicon dioxide layer and form a via therein to expose a portion of the first metallization layer. In accordance with another feature of the invention, the use of two via hole masks in forming the via in the insulating layer has the advantage of removing random defects which might be in any one of the two via hole masks. A second metallization layer is then deposited over the surface and through the vias onto selected portions of the first metallization layer.

BRIEF DESCRIPTION OF THE DRAWINGS

The foregoing features of the invention, as well as the invention itself, may be more fully understood from the following detailed description read together with the accompanying drawings, in which.

DESCRIPTION OF THE PREFERRED EMBODIMENT

Figure 1:
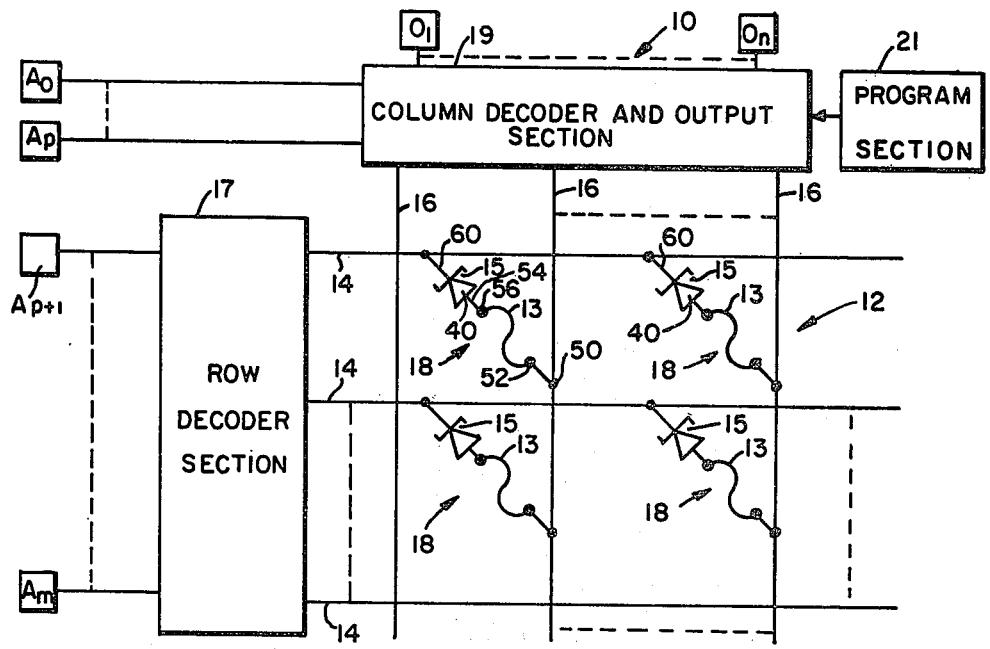
FIG. 1 is a schematic diagram of a programmable read only memory (PROM) including as programmable memory elements thereof fusible links manufactured according to the invention.

Referring now to FIG. 1 a programmable read only memory (PROM) 10 is shown to include a memory array 12 having a matrix of row conductors 14 and column conductors 16 and a plurality of programmable memory elements 18 connected between such row and column conductors as shown. Each one of the memory elements includes a fusible link 13 and a serially connected Schottky diode 15. The row conductors 14 are coupled to a row decoder section 17 and the column conductors 16 are coupled to a column decoder and output section 19. Sections 16, 19 are fed by address signals $A_m$–$A_O$, as shown. A program section 21, of any conventional design, is coupled to the column decoder and output section 19, as shown. The data read from the PROM 10, after programming, appears at output lines $O_1$–$O_n$.

Figure 2:
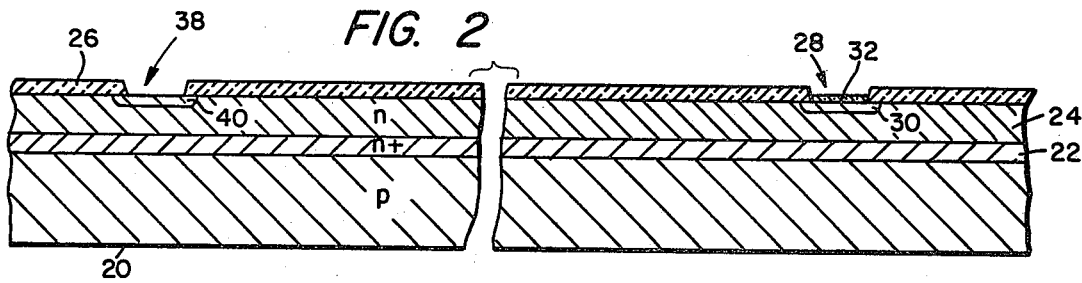
FIGS. 2–9 are cross-sectional elevation views, somewhat distorted, of a programmable memory element used in the PROM of FIG. 1 at various stages in the manufacture thereof.

Referring now to FIGS. 2–9 the steps used to fabricate an exemplary one of the programmable memory elements 18 will be discussed. Referring first to FIG. 2 a substrate 20 of doped semiconductor material, here p type conductivity silicon, has an n+ type conductivity layer 22 formed in a portion of the upper surface thereof using any conventional diffusion technique. Here the n+ type conductivity layer 22 is a layer doped with antimony and such layer 22 has a doping concentration of $10^{20}$ atoms per cubic centimeter. Such layer 22 is here part of the conventional subcollector buried diffusion region associated with bipolar transistor elements used in other circuit components of the PROM 10. Next, an epitaxial layer 24 is formed, here with the thickness of 3.2 micrometers, over the surface of the substrate 20 including the region where the buried n+ type conductivity layer 22 was formed, as shown. Here the epitaxial layer 24 is arsenic doped having a concentration of $5 \times 10^{16}$ atoms per cubic centimeters. Next a layer 26 of insulation material, here a layer of silicon dioxide, is thermally grown over the upper surface of the epitaxial layer 24 in any conventional manner. Here such silicon dioxide layer 26 is grown to a thickness of 5000 Angstroms. The layer 26 is then masked and etched using conventional photolithographic-chemical etching techniques to form a window 28 in a portion of such silicon dioxide layer 26 and thereby to expose an underlying portion of the surface of the epitaxial layer 24 as shown. An n+ type conductivity region 30 is formed in the epitaxial layer, here such region 30 is phosphorous doped with a concentration of $10^{19}$ atoms per cubic centimeters. Further, such region 30 is diffused to a depth of here 5000 Angstroms into the surface of the epitaxial layer 24. During the diffusion process a thin layer 32 of silicon dioxide is thermally grown over the previously exposed portion of the epitaxial layer 24 as shown. The surface of the silicon dioxide layer 26 together with the portion 32 are covered with a suitable photoresist layer (not shown). Such photoresist layer is processed to provide a window 38 in the silicon dioxide layer 26 over a selected portion of the epitaxial layer 24 using conventional photolithographic chemical etching techniques. Next a thin layer of platinum (not shown) is deposited over the surface of the silicon-dioxide layer 26, 32 and over a portion of the silicon epitaxial layer 26 exposed by the window 38. The wafer is then sintered and processed in a conventional manner to form a region 40 of platinum silicide in the upper portion of the epitaxial layer 24, here such region 40 has a depth of 400 Angstroms. Excess platinum is then removed in a conventional manner. The portion 32 of silicon dioxide is then removed with a conventional masking and etching process.

Figure 3:
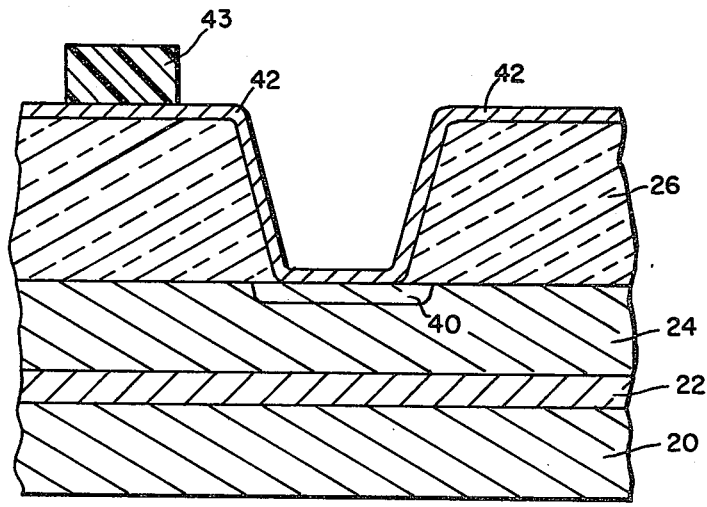
Figure 4:
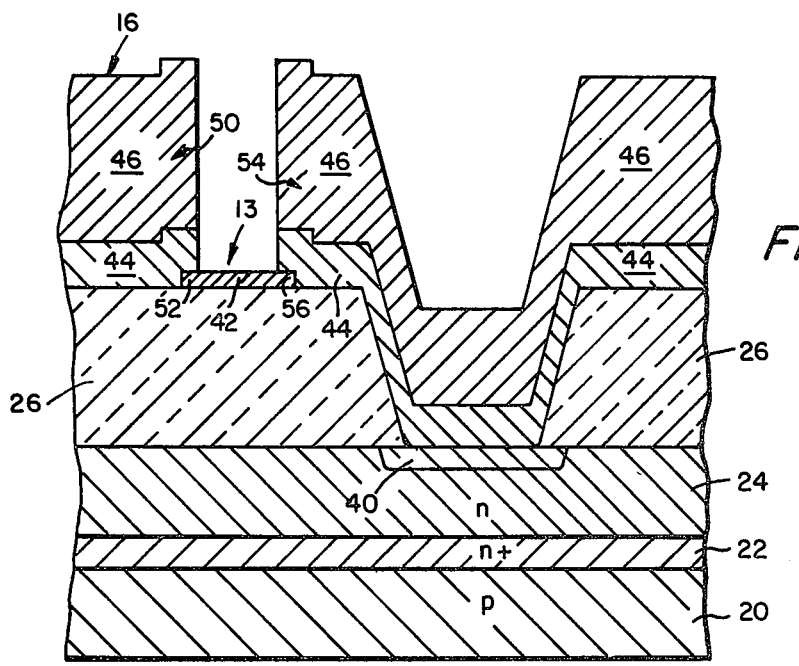

Referring now also to FIG. 3, a layer 42 of fusible material, here a compound of nickel and chrome (NiCr) commonly referred to as Nichrome, is sputtered over the upper surface of the structure, here such layer 42 having a thickness of 200 Angstroms. A layer 43 of photoresist is then deposited over the Nichrome layer 42 and patterned into a mask, as shown, using conventional techniques so that a portion of the photoresist layer 43 remains over the regions where the fusible link is to be formed, as shown in FIG. 3. A suitable etchant, here a cerric ammonium-nitrate solution is brought into contact with the unmasked portion of the Nichrome layer 42 to form the fusible link 13 (FIG. 1) as shown in FIG. 4. Next a layer 44 of a mixture of titanium and tungsten is sputtered over the surface of the structure using any conventional technique, here such layer 44 has a thickness of 1200–1300 Angstroms. Next a layer 46 of aluminum is evaporated over the layer 44 using any conventional technique, here the aluminum layer 46 is formed with a thickness of 4000 Angstroms. The layers 44, 46 together form the first metallization layer for the circuit. Such first metallization layer is then patterned and etched using conventional techniques to form the first metallization pattern of conduction for the device. Referring to FIG. 4 it is noted that a first portion 50 of the first metallization layer is in electrical contact with a first end 52 of the Nichrome layer 42 and a second portion 54 of such first metallization layer is in electrical contact with the second end 56 of the Nichrome layer 42. Thus, referring to FIG. 1 the first portion 50 of the first metallization layer forms one of the column conductors 16, such column conductor 16 being connected to the end 52 of the fusible link 13, as shown. Further a Schottky diode 15 is formed between the second portion 54 of the first metallization layer and the epitaxial layer 24 through the platinum silicide region 40. More particularly, second portion 54 of the first metallization layer is formed in electrical contact with the anode of the Schottky diode 15 as shown in FIG. 1. It is also noted that the first metallization layer is patterned to provide an electrical contact 60 (FIG. 5) to the n+ doped region 30 as shown. The n+ doped region provides ohmic contact between the electrical contact 60 and the epitaxial layer 24 and to the buried n+ layer 22 to provide the Schottky diode 15 (FIG. 1). More particularly, electrical contact 60 provides the contact to the cathode of the Schottky diode 15.

Figure 5:
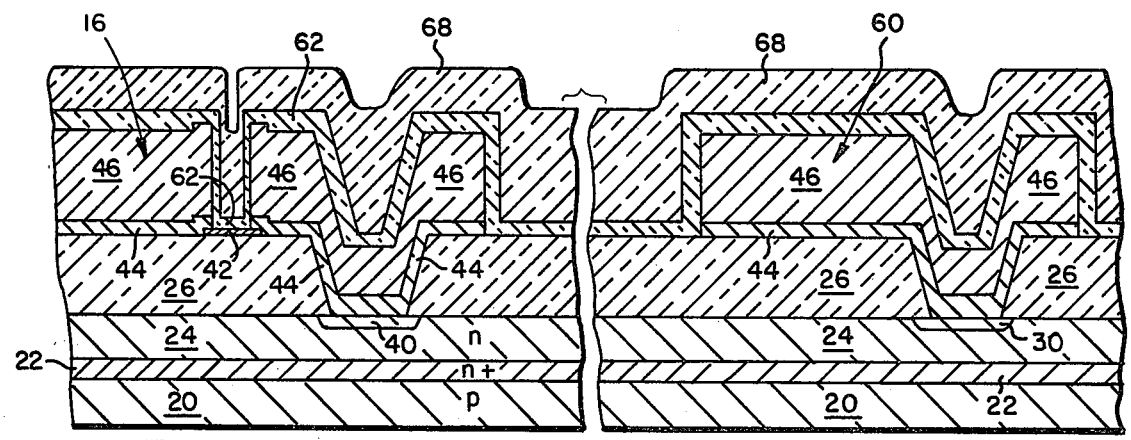
Figure 6:
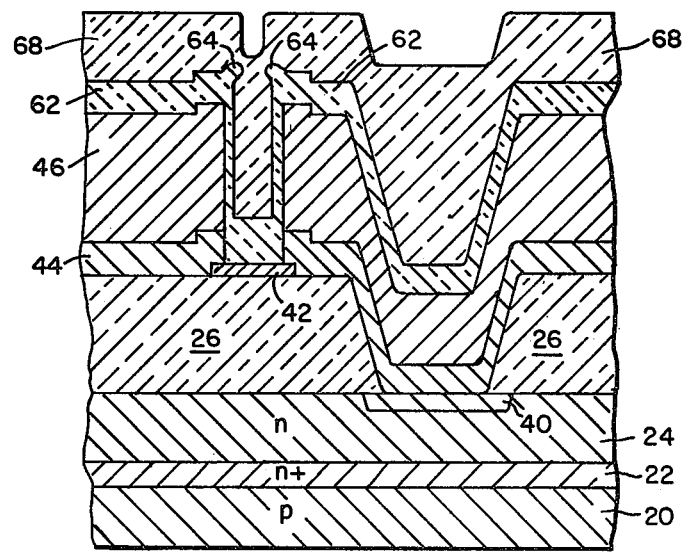
Figure 7:
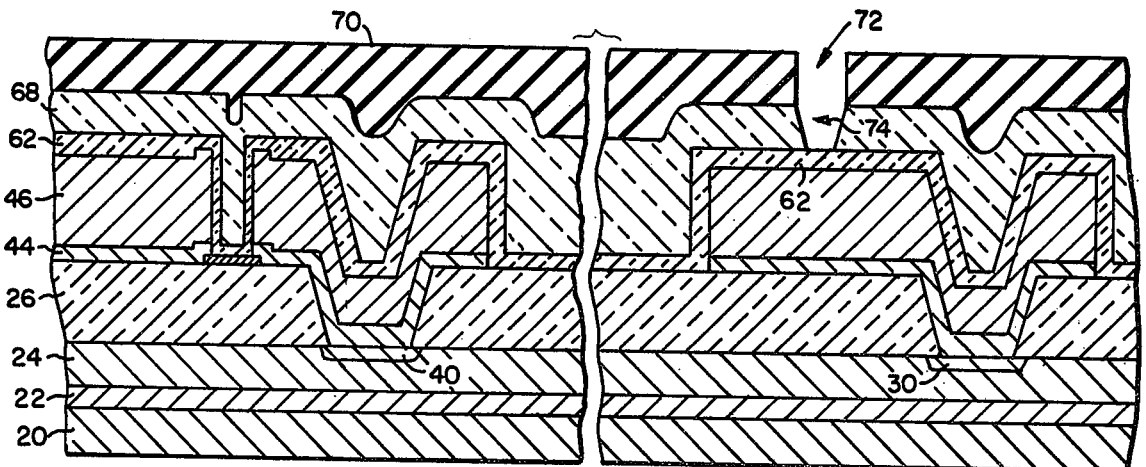
Figure 8:
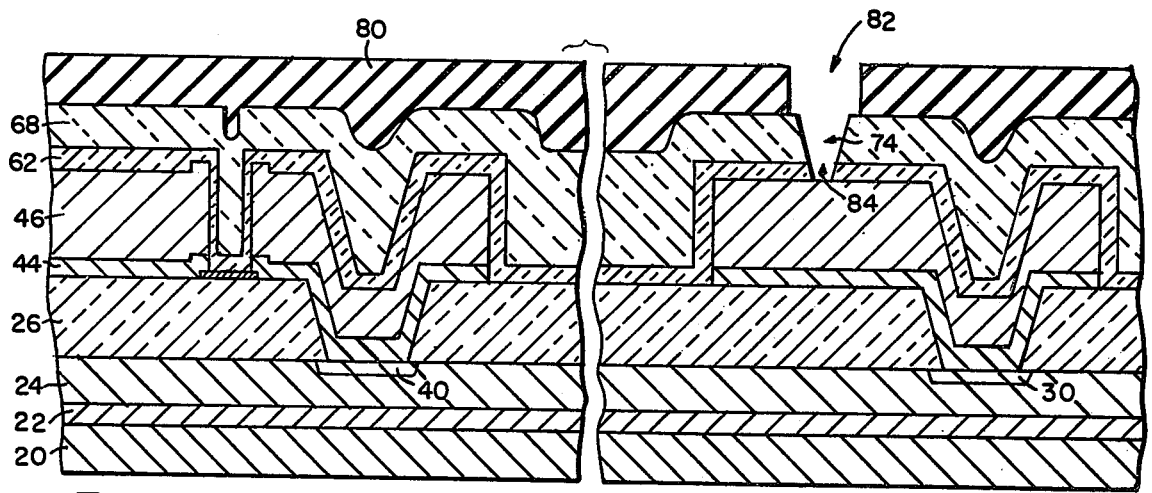
Figure 9:
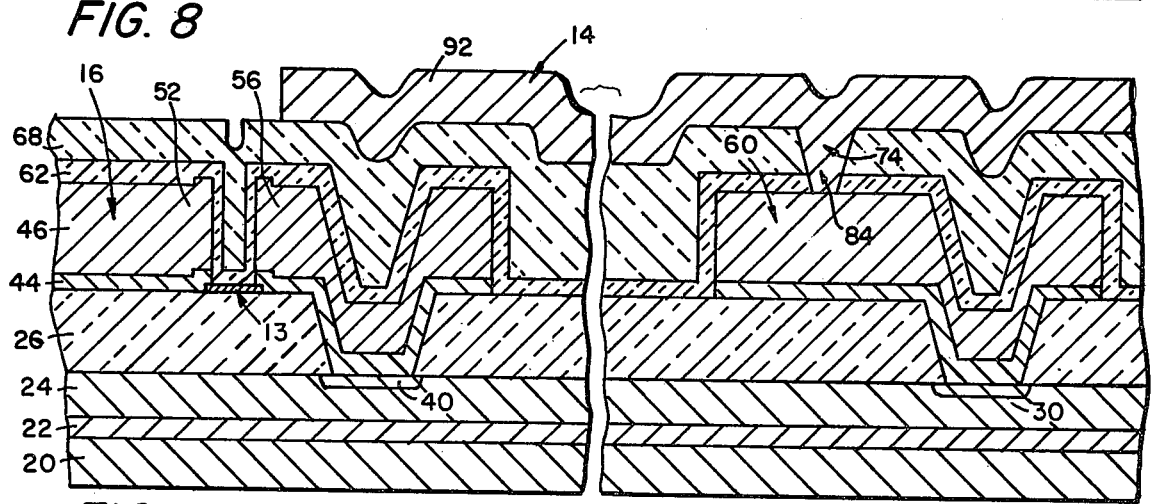

Next, a relatively thin layer 62 of silicon dioxide is chemically vapor deposited over the surface of the structure thus formed. The deposition is carried out at atmospheric pressure so that the thin layer 62 of silicon dioxide provides a good moisture barrier for the Nichrome layer 42. The thickness of the silicon dioxide layer 62 is in the range of 750 Angstroms to 1700 Angstroms, here such layer 62 has a thickness of 1200 Angstroms. The thickness of layer 62 is kept relatively thin in order to minimize the amount of cusping in the regions 64 (FIG. 6) formed over the sharp corners of the aluminum layer 46. That is, while the thickness of the silicon dioxide layer 62 provides adequate moisture protection for the Nichrome layer 42 such thickness will not provide adequate dielectric insulation for the second metallization layer by itself, such second metallization layer to be formed in a manner to be described hereinafter. Next, a layer of a second insulating material, here a layer 68 of silicon nitride is chemically vapor deposited over the layer 62 of silicon dioxide. Such chemical vapor deposition is performed in a vacuum environment (here at 0.2 Torr) using any conventional apparatus. The thickness of the silicon nitride layer 68 is in the range of 3000 to 6000 Angstroms, here such layer 68 has a thickness of 4500 Angstroms as shown in FIGS. 5 and 7.

A layer 70 (FIG. 7) of photoresist is then formed over the surface of the structure as shown and suitably processed to provide an etch resistant mask having a window 72 formed therein to provide a first via hole mask for the second metallization layer to be formed hereinafter. The exposed portion of the silicon nitride layer 68 is etched here using a plasma etching technique to form a via 74 through such portion of the silicon nitride layer 68 as shown in FIG. 7. It is noted that the plasma etch is selective or self-stopping in that it will etch the underlying portion of the silicon dioxide layer 62 at a relatively low rate. That is, the plasma etching, here using Freon gas, etches the exposed portion of the silicon nitride layer 68 at a significantly higher rate than it etches the silicon dioxide layer 62, therefore the etching process is selective and hence will substantially self-terminate at the after etching the silicon nitride layer 68. The photoresist layer 70 is then stripped and the new photoresist layer 80 (FIG. 8) is formed over the surface of the structure, such layer 80 is patterned to provide a second via hole mask having a window 82 formed over the via 74 formed in the silicon nitride layer 68 as shown. A suitable chemical etchant here an ammonium fluoride-hydrofluoric acid mixture which selectively etches only the silicon dioxide layer 62 to form a via 84 in such layer 62. It is noted that since such etchant is selective that it will not not significantly etch the silicon nitride layer 68. Therefore the silicon nitride layer 68 serves as an etch resistant mask for the chemical etching of the exposed silicon dioxide layer 68. Thus, the second via hole mask formed with the photoresist layer 80 may be a noncritically aligned mask. The advantage in using two via hole masks with insulation layers of two different materials and different selective etchants is that if there are defects in the first via hole mask which might result in unwanted pin holes being formed through the layer 68 of silicon nitride such pin holes will not pass to the epitaxial layer 24 because of the silicon dioxide layer 62 under the silicon nitride layer 68 will not be significantly etched by the silicon nitride etchant. Further, any defects in the second via hole mask provided by layer 80 which might (absent silicon nitride layer 68) result in unwanted pin holes being formed through the thin silicon dioxide layer 62 will not be formed since the silicon nitride layer 68 is not significantly etched by the silicon dioxide etchant.

Figure 10:
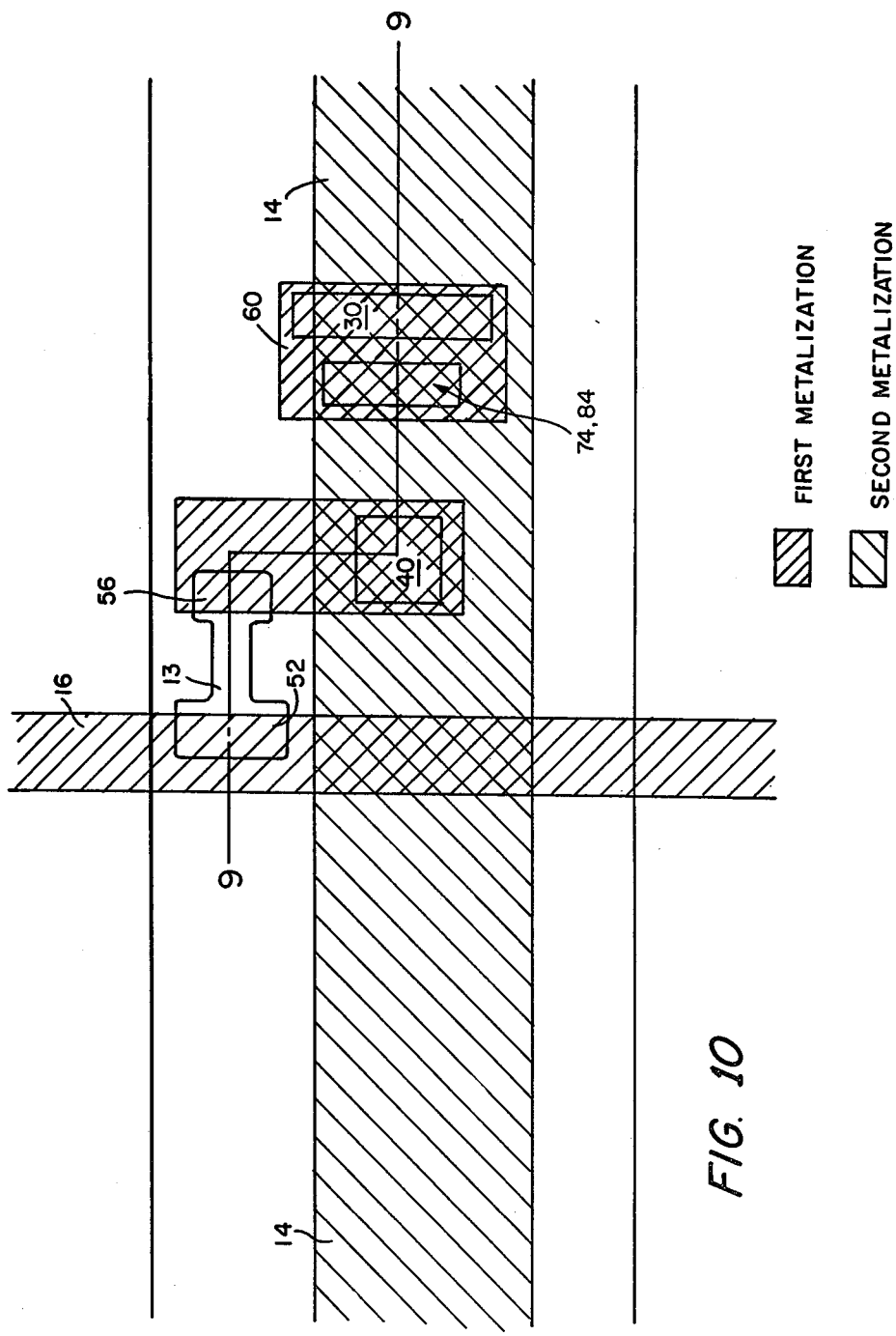
FIG. 10 is a schematic plan view of the programmable memory element manufactured in accordance with the stages shown in FIGS. 2–9, the cross-sectional elevation view in FIG. 9 being taken along the line 9—9 of FIG. 10.

The layer 80 of photoresist is then stripped from the surface of the structure thus formed using any conventional technique and a second metallization layer 92 is then deposited over the surface of the structure and through vias 74, 84 (FIG. 9) to electrically contact the portion of the electrical contact 60. Here such second metallization layer 92 is formed by the first sputtering a layer of titanium 1200 to 1800 Angstroms thick and then evaporating a layer of aluminum here 12000 Angstroms thick over the previously deposited titanium layer. The layers are then selectively etched to form a second metallization pattern as shown in FIG. 10. Thus, referring also to FIG. 1 electrical contact 60 provides electrical connection to the row conductor 14 (FIG. 1) formed by the second metallization layer.

Having described a preferred embodiment of the invention it will now be apparent to one of skill in the art that other embodiments incorporating its concept may be used. It is believed therefore that this invention should not be restricted to the disclosed embodiment but rather should be limited only by the spirit and scope of the appended claims.

What is claimed is:

1. In combination:
  (a) a layer of fusible material;
  (b) a first layer of metal in contact with the fusible material;
  (c) a plurality of layers of different insulating materials selected from the group consisting of silicon dioxide and silicon nitride and disposed over the first layer of metal and over a portion of the fusible material, such plurality of layers having a via formed therein exposing a portion of the first layer of metal;
  (d) a second layer of metal disposed over the plurality of layers of insulating material, a portion of such second layer of metal extending through the via into the exposed portion of the first layer of metal.

2. The combination recited in claim 1 wherein the fusible material is Nichrome.

3. The combination recited in claim 1 wherein the silicon dioxide layer has a thickness in the range of 750 to 1700 Angstroms and the silicon nitride layer has a thickness in the range of 3000 to 6000 Angstroms.

* * * * *

UNITED STATES PATENT OFFICE
CERTIFICATE OF CORRECTION

Patent No. 4,481,263          Dated November 6, 1984

Inventor(s) Kersi F. Cooper and Jerry W. Drake

It is certified that error appears in the above-identified patent and that said Letters Patent are hereby corrected as shown below:

On Cover Sheet, Item [73] Assignee: Change "Raytheon Company, Lexington, MO" to --Raytheon Company, Lexington, MA--.

Signed and Sealed this

Sixteenth Day of July 1985

[SEAL]

Attest:

DONALD J. QUIGG

Attesting Officer      Acting Commissioner of Patents and Trademarks